(12) United States Patent
Su et al.

(10) Patent No.: US 7,982,641 B1
(45) Date of Patent: Jul. 19, 2011

(54) CONTEXT-BASED ADAPTIVE BINARY ARITHMETIC CODING ENGINE

(75) Inventors: Guan-Ming Su, Fremont, CA (US); Leung Chung Lai, Union City, CA (US); Wenchi Hsu, Milpitas, CA (US); Qian Tang, San Jose, CA (US); Li Sha, San Jose, CA (US); Ching-Han Tsai, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/613,830

(22) Filed: Nov. 6, 2009

Related U.S. Application Data (60) Provisional application No. 61/112,043, filed on Nov. 6, 2008.

(51) Int. Cl.
*H03M 7/00* (2006.01)
(52) U.S. Cl. .......................................... 341/107; 341/51
(58) Field of Classification Search ................... 341/50, 341/51, 52, 67, 94, 107
See application file for complete search history.

(56) References Cited

U.S. PATENT DOCUMENTS

| | | | | |
|---|---|---|---|---|
| 7,221,296 | B2 * | 5/2007 | Ziauddin et al. | 341/107 |
| 7,262,721 | B2 * | 8/2007 | Jeon et al. | 341/107 |
| 7,834,782 | B2 * | 11/2010 | Bacri | 341/67 |

OTHER PUBLICATIONS

ITU-T Telecommunication Standardization Sector of ITU; H.264 (Mar. 2005); Series H: Audiovisual and Multimedia Systems; Infrastructure of audiovisual services—Coding of moving video; Advanced video coding for generic audiovisual services; 343 pages.
Arithmetic Coding revealed; A guided tour from theory to praxis; Eric Bodden, Malte Clasen, and Joachim Kneis; Translated and updated version, May 2004; 57 pages.

* cited by examiner

*Primary Examiner* — Brian Young (57) ABSTRACT

A system including a binarization module, an encoding module, and a prediction module. The binarization module is configured to binarize a syntax element and to generate symbols. The encoding module is configured to encode the symbols using context-adaptive binary arithmetic coding (CABAC). The prediction module is configured to generate a prediction for a number of renormalizations to be performed to renormalize an interval range when encoding one of the symbols. The encoding module encodes a next symbol following the one of the symbols based on the prediction before renormalization of the interval range is actually completed.

18 Claims, 6 Drawing Sheets

CONTEXT-BASED ADAPTIVE BINARY ARITHMETIC CODING ENGINE

CROSS-REFERENCE TO RELATED APPLICATIONS

This application claims the benefit of U.S. Provisional Application No. 61/112,043, filed on Nov. 6, 2008. The disclosure of the above application is incorporated herein by reference in its entirety.

FIELD

The present disclosure relates to video data compression and more particularly to a context-based adaptive binary arithmetic coding (CABAC) engine used to compress video data.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Video data is typically compressed using video encoding before the video data can be stored and/or transmitted. For example, video encoding is used in digital versatile discs (DVDs), digital television broadcasts, and audiovisual and multimedia systems. Video encoding is also used in video-conferencing, Internet-based video streaming, and motion pictures.

H.264 Advanced Video Coding (H.264/AVC) is a recommendation published by the Telecommunication Standardization Sector of the International Telecommunication Union (ITU-T). The H.264/AVC recommendation specifies syntax for compressed video data. Additionally, the H.264/AVC recommendation specifies a video decoder (decoder) for decoding the syntax. The H.264/AVC recommendation is incorporated herein by reference in its entirety.

Vendors may develop video encoders that comport with the decoder specified by the H.264/AVC recommendation. A video encoder (encoder) typically partitions a frame of video data (e.g., a picture) into units called macroblocks. For each macroblock, the encoder generates a prediction based on previously encoded data. The encoder subtracts the prediction from the macroblock to generate a residual. The residual is transformed into a set of transform coefficients using an integer transform. The transform coefficients are then quantized (i.e., divided by an integer).

Additionally, the encoder generates side information that allows the decoder to decode and reconstruct the video data from the encoded data. The side information includes information about the structure of the compressed video data. Additionally, the side information includes information about encoding processes used to encode the video data. The encoder encodes the quantized transform coefficients and the side information and generates a compressed bitstream. The compressed bitstream may be stored and/or transmitted.

SUMMARY

A system comprises a binarization module, an encoding module, and a prediction module. The binarization module is configured to binarize a syntax element and to generate symbols. The encoding module is configured to encode the symbols using context-adaptive binary arithmetic coding (CABAC). The prediction module is configured to generate a prediction for a number of renormalizations to be performed to renormalize an interval range when encoding one of the symbols.

In other features, the encoding module encodes a next symbol following the one of the symbols based on the prediction before renormalization of the interval range is actually completed.

In other features, the system further comprises a processing module configured to complete renormalization of the interval range based on the prediction.

In other features, the system further comprises a processing module configured to generate an encoded bitstream for the symbols based on the prediction.

In other features, a device comprises the system and further comprises a decoder module and a display. The decoder module is configured to decode the symbols encoded by the encoding module and to output video data. The display is configured to display the video data.

In other features, a device comprises the system and further comprises a storage module and a transmit module. The storage module is configured to store the symbols encoded by the encoding module. The transmit module is configured to transmit the symbols encoded by the encoding module.

In still other features, a method comprises binarizing a syntax element and generating symbols and encoding the symbols using context-adaptive binary arithmetic coding (CABAC). The method further comprises generating a prediction for a number of renormalizations to be performed to renormalize an interval range when encoding one of the symbols.

In other features, the method further comprising encoding a next symbol following the one of the symbols based on the prediction before renormalization of the interval range is actually completed.

In other features, the method further comprising a completing renormalization of the interval range based on the prediction.

In other features, the method further comprising generating an encoded bitstream for the symbols based on the prediction.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Video encoders use entropy coding, which is a lossless coding scheme, to encode video data and to generate compressed video data. Context-based adaptive binary arithmetic coding (CABAC) is an entropy coding scheme. In CABAC, binary decisions (i.e., 1's and 0's) are encoded using binary arithmetic encoding. Accordingly, symbols having non-binary values (e.g., transform coefficients) are first binarized or converted into binary values before binary arithmetic coding can be used.

Typically, an element of data represented in the bitstream generated by the encoder is called a syntax element. For example, a transform coefficient is a syntax element. Binarization is a process of mapping possible values of a syntax element onto a set of bin strings. A bin string is a binary representation of the values of a syntax element. For example, a bit of a bin string is called a bin. A first bit of the bin string is bin 1, a second bit of the bin string is bin 2, and so on.

After a syntax element is binarized, a suitable context model is selected for each bin according to past observations of the syntax element. The selected context model provides two probability estimates: the probability that the bin contains a 1 and the probability that the bin contains a 0. Different context models may be maintained for each syntax element.

Each bin is encoded with adaptive binary arithmetic coding using the probability estimates. After encoding each bin, the probability estimate in the selected context is updated. For example, for a selected context model, if the bin contains a 1, a frequency count of 1's is incremented. Accordingly, next time the context model is selected, the probability that the bin contains a 1 is higher. The context models are reset at the beginning of each slice of a picture frame. The H.264/AVC recommendation defines binarization schemes and context models for each syntax element.

Arithmetic code generates one code for a sequence of symbols by encoding the symbols sequentially. The arithmetic code represents sequences of symbols as numbers in a unit interval [0,1]. The unit interval includes infinite real numbers. Accordingly, every sequence can be encoded to a unique number in the unit interval.

When a first symbol in a sequence is received, the unit interval [0,1] is partitioned into subintervals according to the probability of the symbol. Partitioning is repeated for each subsequent symbol in the sequence. Thus, the interval is refined to a unique number that represents the sequence.

The upper and lower bounds of an interval are called high and low, respectively. For example, for the unit interval [0,1], high is 1, and low is 0. Range of an interval is defined as a difference between high and low. That is, Range=(High−Low). Values of high, low, and range change during encoding as the interval is refined. Probabilities of symbols fall in the range [0,1]. The highs, lows, and ranges of the subintervals are calculated from cumulative probabilities.

Partitioning of intervals continues as additional symbols in the sequence are received during encoding. Final values of high, low, and range from encoding of a current symbol are used as initial values when encoding a next symbol. In an encoder having finite precision, the values of high and low may converge after a finite number of symbols are received. Accordingly, with finite precision, encoding cannot continue when the values of high and low converge. Therefore, scaling techniques are used to renormalize (i.e., rescale or re-enlarge) a subinterval when values of high and low for the subinterval converge.

Generally, in multi-symbol arithmetic encoding, to map sequences of symbols into the unit interval, a cumulative distribution function (CDF), $F_X(i)$, is used. The unit interval is divided into subintervals of the form $[F_X(i-1), F_X(i))$, $i=1,\ldots,m$. A minimum value of the CDF is 0, and a maximum value of the CDF is 1. The whole unit interval is partitioned by $\{F_X(i)\}$. Each subinterval $[F_X(i-1), F_X(i))$ is associated with one symbol, say $a_i$. For example, the subinterval for a first symbol $a_k$ is $[F_X(k-1), F_X(k))$. This subinterval is further partitioned in the same proportion as the original interval.

Accordingly, a $j^{th}$ interval corresponding to a symbol $a_j$ may be expressed as $[(F_X(k-1)+F_X(j-1))/(F_X(k)-F_X(k-1)), (F_X(k-1)+F_X(j))/(F_X(k)-F_X(k-1)))$. For each successive symbol, the subinterval is further partitioned in the same proportion. The lower bound and upper bound of a current interval are tracked using the following algorithm:

```
HIGH=1; LOW=0;
while(no symbol to encode){
  n=ReadSymbol( )
  RANGE=HIGH-LOW;
  HIGH=LOW+RANGE*CDF(n);
  LOW=LOW+RANGE*CDF(n-1);
}
```

As an interval narrows, one of three possibilities can arise: (1) The interval may be confined to a lower half of the unit interval [0,0.5). (2) The interval may be confined to a upper half of an unit interval [0.5,1). (3) The interval may straddle the midpoint of the unit interval. Accordingly, different scaling methods may be used to renormalize the interval.

Figure 1A:
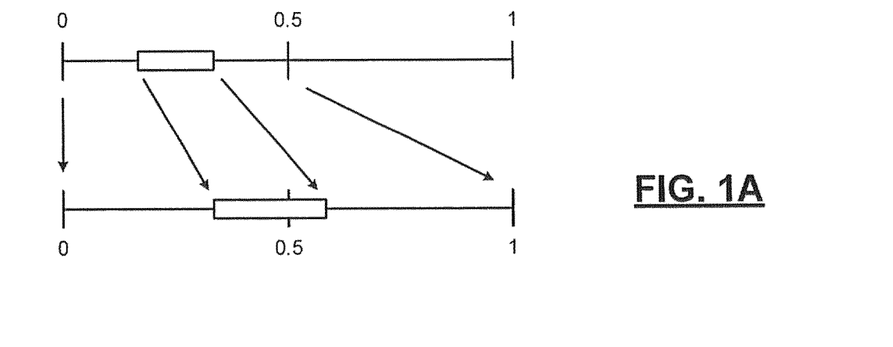
FIGS. 1A-1C depict scaling schemes used in context-adaptive binary arithmetic coding (CABAC)
Figure 1B:
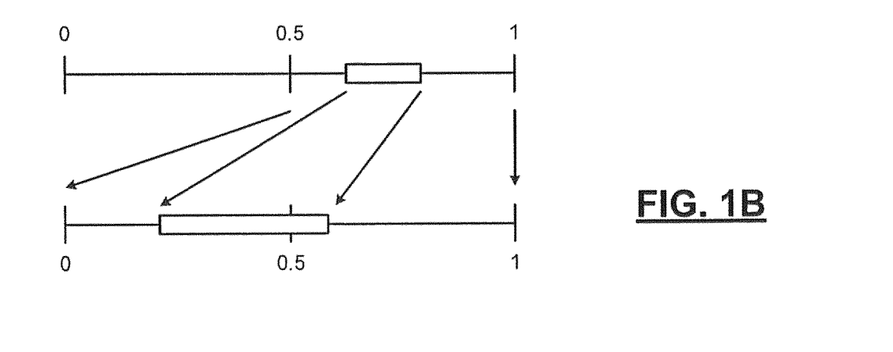
Figure 1C:
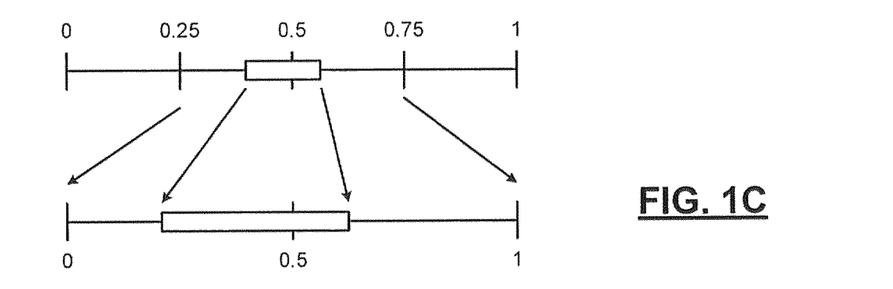

Referring now to FIGS. 1A-1C, examples of the scaling methods used to renormalize the interval are shown. The scaling methods shown are called E1, E2, and E3 scaling in arithmetic coding. In FIG. 1A, E1 scaling is used when a subinterval is confined to the lower half of the unit interval [0,0.5). For example, when the subinterval [LOW,HIGH) is confined to the lower half of the unit interval [0,0.5), LOW is represented as 0.0xxxxxx, and HIGH is represented as 0.0xxxxxx. "x" means don't care (i.e., x can be 0 or 1). Accordingly, a bit 0 is output. Then HIGH and LOW are shifted left by 1 bit. Thus, the E1 scaling includes multiplying HIGH and LOW by 2.

In FIG. 1B, E2 scaling is used when the subinterval is confined to the upper half of the unit interval [0.5,1). For example, when the subinterval [LOW,HIGH) is confined to the upper half of the unit interval [0.5, 1), LOW is represented as 0.1xxxxxx, and HIGH is represented as 0.1xxxxxx. Accordingly, a bit 0 is output. 0.5 is subtracted from HIGH and LOW. Then HIGH and LOW are shifted left by 1 bit. Thus, E2 scaling includes performing the operations HIGH=2*(HIGH-0.5), and LOW=2*(LOW-0.5).

In FIG. 1C, E3 scaling is used when the subinterval straddles 0.5. For example, when the subinterval [LOW, HIGH) straddles 0.5, LOW is represented as 0.0xxxxxx, and HIGH is represented as 0.1xxxxxx. E1 and E2 scaling cannot apply. Instead, E3 scaling is used. 0.25 is subtracted from both HIGH and LOW. Then HIGH and LOW are shifted left by 1 bit. Thus, E3 scaling includes performing the operations HIGH=2*(HIGH-0.25), and LOW=2*(LOW-0.25).

E3 scaling does not output a bit during incremental encoding. However, performing E3 scaling N times followed by performing an E1 scaling is equivalent to performing one E1 scaling followed by performing E2 scaling N times. Additionally, performing E3 scaling N times followed by performing an E2 scaling is equivalent to performing one E2 scaling followed by performing E1 scaling N times. The number of E3 scaling may be tracked using a counter (e.g., a counter called, bitOutStanding, used in the H.264/AVC recommendation). Subsequently, when an E1 or E2 scaling is encountered, the counter is checked, and the above method is employed to determine the output.

Generally, the arithmetic coding is slow since it involves a series, of decisions and multiplications to re-partition multiple subintervals for each symbol. The complexity can be reduced by using binary arithmetic coding having only two symbols (1 and 0). Encoding symbol 1 only needs updating RANGE and LOW while encoding symbol 0 only needs updating RANGE.

Although using binary arithmetic coding reduces complexity, the encoder still waits for renormalization to complete for each symbol. The encoder waits to obtain final values of RANGE and LOW before encoding next symbol in a sequence. Since renormalization is computationally intensive and time-consuming, waiting for renormalization to complete degrades performance of the encoder.

The present disclosure relates to predicting the result of renormalization for a symbol being encoded and using the prediction to encode a next symbol instead of waiting for the renormalization to complete. Additionally, a message comprising the prediction is generated and forwarded to a renormalization post-processing (RPP) module that processes the message and generates an encoded bitstream. Before describing generation of the prediction, generation of the message, and operation of the RPP module, the architecture of a CABAC encoder is discussed.

CABAC has three main characteristics: (1) CABAC uses multiplier-free binary arithmetic coding with lookup table-based interval subdivision. (2) CABAC uses lookup table-based adaptive probability update to self-adjust probability distribution. (3) CABAC uses context-based compression to utilize existing/historic information for more skewed probabilities.

The basic encoding flow of CABAC includes three steps: (1) Step 1 includes binarization and context modeling. (2) Step 2 includes probability/most probable symbol (MPS) lookup and update. (3) Step 3 includes binary arithmetic coding. Each step is described in turn.

Step 1: Binarization and context modeling: Binary arithmetic coding accepts binary input. The value of a syntax element (i.e., syntax element value or SEV), however, may not always be in a binary format. Accordingly, the SEV is first binarized. That is, binarization or mapping of the SEV into a sequence of binary values (called "bin string") is first performed. Each binary value has an associated probability for arithmetic encoding and is referenced to a storage bit (called "bin").

Step 2: Probability/MPS lookup and update: For each mapped bin, a value of the bin and its associated probability are encoded using a binary arithmetic coding engine. The probability is updated according to the occurrence of a most probable symbol (MPS) or a least probable symbol (LPS). The MPS is updated (switched) when a higher frequency of occurrence of a bin value changes from 0 to 1 or from 1 to 0.

Step 3: Binary arithmetic coding: Based on MPS/LPS and the probability, the binary arithmetic coding engine refines the interval in its number line. When the interval is less than ¼, the interval is renormalized (enlarged).

Thus, based on the above coding flow, the CABAC encoder comprises three modules: a binarization module, a context state module, and a binary arithmetic coding engine. The binary arithmetic coding engine is also called a modulo coder (M coder) module. Each module is described in detail below.

Figure 2A:
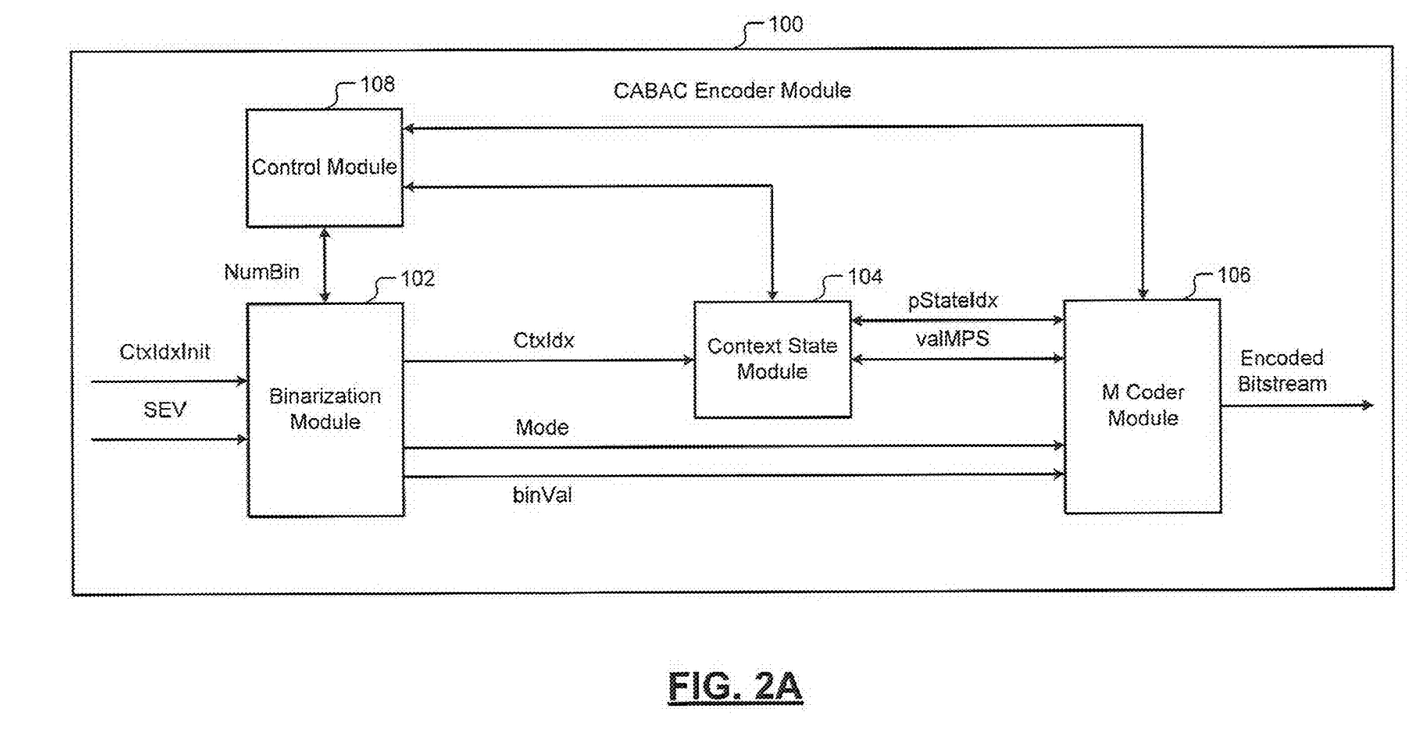
FIG. 2A is a functional block diagram of a CABAC encoder.
Figure 2B:
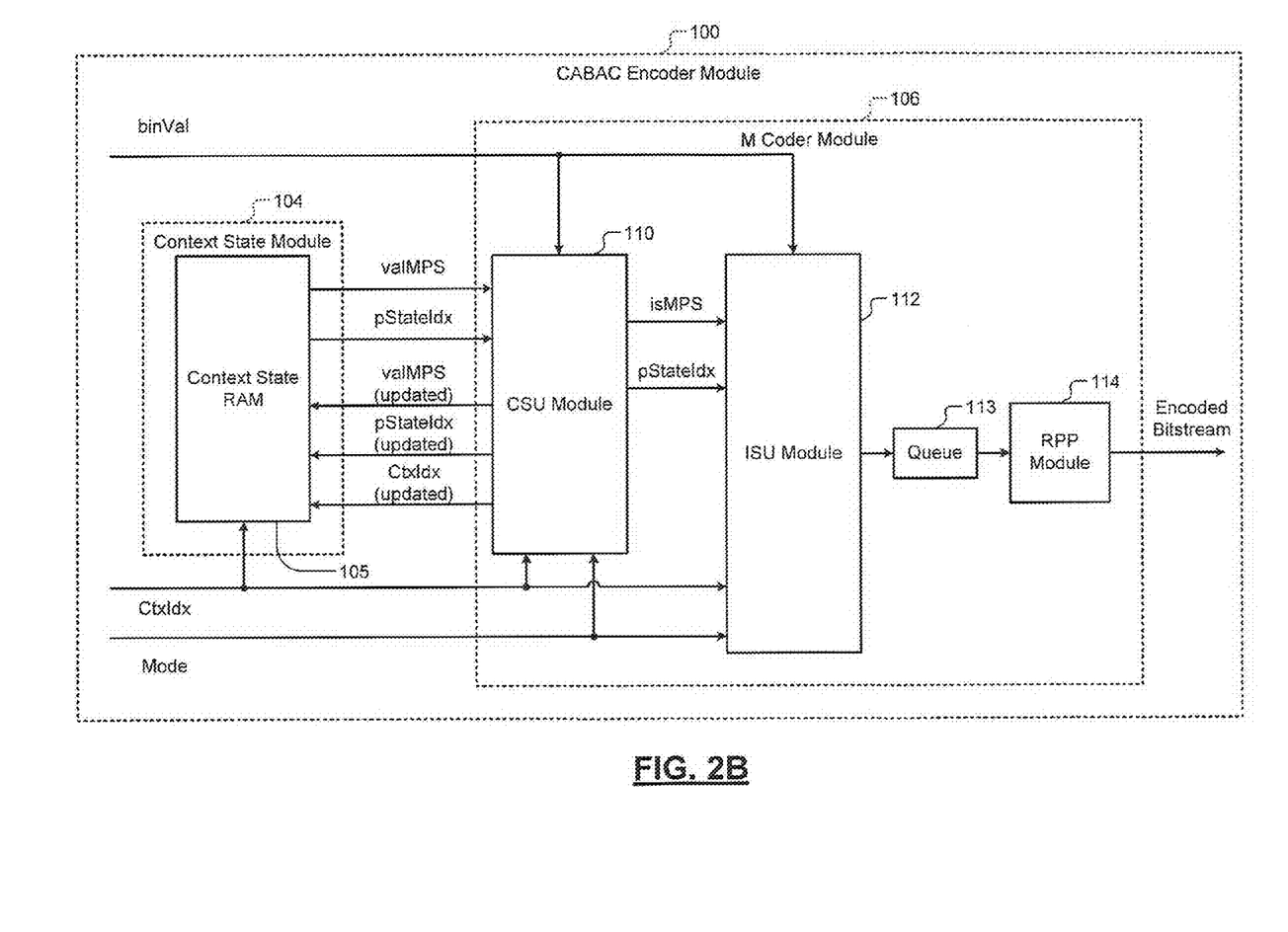
FIG. 2B is a functional block diagram of the CABAC encoder showing details of a modulo coder (M coder) module.
Figure 2C:
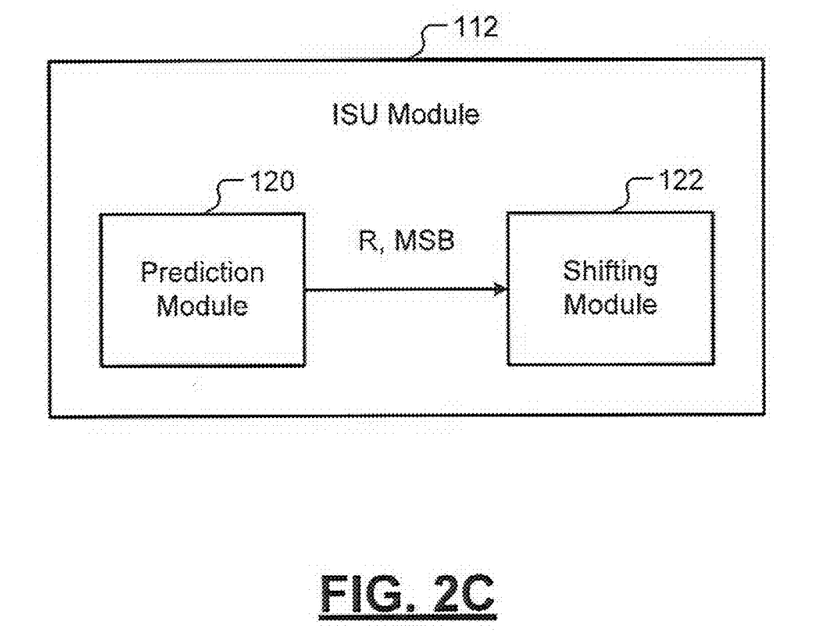
FIG. 2C is a functional block diagram of an interval subdivision update (ISU) module used in the M coder module of FIG. 2B.

Referring now to FIGS. 2A-2C, a CABAC encoder module 100 is shown. In FIG. 2A, the CABAC encoder module 100 comprises a binarization module 102, a context state module 104, an M coder module 106, and a control module 108. The binarization module 102 receives the following inputs: a type of SEV (called CtxIdxInit, entry ID) and a value of the SEV. The context modeling is done by the input of SEV type. The binarization module 102 generates the following outputs: a sequence of binarized values (called binVal), a mode of each bin, and corresponding context IDs (called CtxIdx). The mode denotes whether the encoding is normal encoding or bypass encoding. The context IDs facilitate probability lookup from a context state random access memory (RAM) included in the context state module 104.

The context state module 104 includes a context state RAM 105 (shown in FIG. 2B). The context state RAM 105 includes a lookup table that receives CtxIdx as input. The context state module 104 generates the following outputs: a current probability (called pStateIdx) and a value of MPS (called valMPS). Each entry in the lookup table is updated based on feedback received from the M coder module 106.

The M coder module 106 includes a Binary Arithmetic Coding Engine. The M coder module 106 is the main core of the CABAC encoder module 100. The M coder module 106 receives the following inputs: binVal, mode, pStateIdx, and valMPS. The M coder module 106 outputs encoded bitstreams.

More specifically, the binarization module 102 binarizes the input SEV value and generates corresponding CtxIdx for each binarized SEV value. The binarization module 102 can binarize a plurality of SEV values in parallel using lookup tables. The binarization module 102 generates the following outputs: NumBin, CtxIdx, Mode, and binVal.

NumBin is a value indicating the number of bins to be processed for a current syntax element. The value of NumBin is used as an initial value in a counter to count down to 0. For example only, NumBin may be a 6-bit value. A maximum number of bins among all binarized SEVs may be 46, for example.

CtxIdx is a sequence of context index used to look up the context state RAM 105. Each CtxIdx may use 9 bits, for example. An entry to store the whole sequence CtxIdx may use 16 bits, for example.

Mode is a sequence of encoding mode (0: normal, 1: bypass) that indicates how each bin is to be encoded. Each bin uses one bit to represent the mode. The encoding mode after entry 16, for example, is bypass mode. Bypass mode does not use probability input. Accordingly, CtxIdx is not used in bypass mode. binVal is a sequence of binarized values.

The values used in the examples may be selected and may vary depending on design specifications of the CABAC encoder module 100. For example, the values may be selected and may vary depending on considerations related to quality and implementation of the CABAC encoder module 100.

The context state module 104 includes context states that are initialized at a beginning of a slice of a picture frame being encoded. The control module 108 initializes the context states based on initialization parameters. The context states are downloaded from the control module 108 into the context state RAM 105 via a configuration write interface (not shown). Contents of each context state include pStateIdx and valMPS.

In FIG. 2B, the M coder module 106 comprises a context state update (CSU) module 110, an interval subdivision update (ISU) module 112, and a renormalization post-processing (RPP) module 114. The CSU module 110 updates probability estimation and controls switching of MPS/LPS. The ISU module 112 calculates the interval subdivision. The renormalization procedure is encapsulated as a message for post-processing by the RPP module 114.

Accordingly, a "while loop" that is otherwise performed during normal processing and that leads to waiting during normal processing is avoided. Instead, the RPP module 114 post processes the messages received from the ISU module 112. A queue 113 is created between the ISU module 112 and the RPP module 114 to absorb traffic jitter. The queue 113 is hereinafter referred to as RPP queue.

The context state RAM 105 stores values of pStateIdx and valMPS for context state of each bin. The initial values are derived and configured by the control module 108 (or via firmware). For example, the control module 108 may derive the initial values according to the H.264/AVC recommendation.

In FIG. 2B, the CSU module 110 performs probability estimation update and MPS/LPS switch control. The CSU module 110 receives the following inputs: (1) pStateIdx and valMPS received from the context state RAM 105, and (2) CtxIdx and binVal received directly from a buffer from the binarization module 102. The CSU module 110 determines whether binVal and valMPS match and updates the probability. The updated probability is written back to context state RAM 105 for the associated context state. Data is forwarded if a bin is consecutively used.

The ISU module 112 calculates the interval subdivision by maintaining the lower bound (codILow) and range (codIRange). Additionally, the ISU module 112 may perform renormalization. The ISU module 112 receives the following inputs: (1) is_MPS, (2) pStateIdx, (3) vinVal, and (4) mode. The ISU module 112 outputs a message comprising (1) a truncated lower bound of interval, and (2) a value representing a number of renormalization. For example only, the ISU module 112 may output a truncated lower bound of interval (maximum of 8 bits) and a 3-bit value representing a number of renormalization.

The RPP module 114 processes messages received from the ISU module 112. Thus, the wait associated with renormalization (e.g., the while loop that is otherwise used during renormalization) is eliminated. Instead, the RPP module 114 completes the renormalization by batch processing the information contained in the messages received from the ISU module 112. The RPP module 114 generates the encoded bitstream.

The operations of the CSU module 110, the ISU module 112, and the RPP module 114 are now described in further detail. Pseudo codes are used only as examples in describing the operations.

The CSU module 110 is active when mode is normal mode. For example only, the following pseudo code may be used:

```
is_MPS=(binVal==valMPS);
if(is_MPS) {
    valMPS_update=valMPS;
    pStateIdx_update=transidxMPS[pStateIdx]
}
else{
    valMPS_update=(pStateIdx==0)? 1—valMPS: valMPS;
    pStateIdx_update=transidxLPS[pStateIdx];
}
```

In the above pseudo code, state transition lookup tables transidxMPS and transidxLPS are as defined in Table 9-36 on page 241 of the H.264/AVC recommendation. is_MPS and pStateIdx are used by the ISU module 112 for interval update. valMPS_update and pStateIdx_update are written back to the context state RAM 105 at address CtxIdx.

The ISU module 112 operates differently depending on the mode; e.g., normal encoding mode, bypass encoding mode, and termination encoding mode. Two internal registers codIRange and codILow are maintained. For example only, codIRange may be 9 bits, and codILow may be 11 bits. For example only, the initial value of codIRange may be set to 0x1FE, and the initial value of codILow may be set to 0x000.

When mode is set to normal encoding mode, the ISU module 112 performs the following three steps: Step 1: The ISU module 112 determines the interval range (codIRange) and interval lower bound (codILow). For example only, the following pseudo code may be used:

```
qCodIRangeIdx=codIRange[7:6];
codIRangeLPS=rangeTabLPS[pStateIdx]
    [qCodIRangeIdx];
codIRangeMPS=codIRange−codIRangeLPS;
if(is_MPS){
    codIRange=codIRangeMPS;
}
else{
    codIRange=codIRangeLPS;
    codILow=codILow+codIRangeMPS;
}
```

In the above pseudo code, the lookup table rangeTabLPS is as defined in Table 9-35 on page 240 of H.264/AVC recommendation. Additionally, notations used in pseudo codes throughout the present disclosure conform to verilog syntax. For example, according to the verilog syntax, the notation codIRange[7:6] means bit 7 to bit 6 of codIRange.

Step 2: To avoid the interval range codIRange less than W, the ISU module 112 performes renormalization. For example, the ISU module 112 rescales the interval range (codIRange) such that codIRange is not less than 0x100. The scaling factor is 2 at each iteration, and the total number of iterations can be predetermined by counting the number of zeros between the first non-zero MSB in codIRange and 0x100. The ISU module 112 rescales the interval lower bound (codILow) by the same magnitude. The MSB of codILow is modified according to a pattern in the higher bit location of codILow.

For example only, the following pseudo code may be used:

```
// determine the number of iteration and MSB of codILow
    switch(codIRange)}
    case 9'b1xxxxxxxx: num_renorm=0; codILow_MSB=0;
```

```
    case        9'b01xxxxxxx:       num_renorm=1;
        codILow_RPP=codILow[9:8];   codILow_MSB=
        (codILow_RPP==2'b11);
    case        9'b001xxxxxx:       num_renorm=2;
        codILow_RPP=codILow[9:7];   codILow_MSB=
        (codILow_RPP==3'b111);
    case        9'b0001xxxxx:       num_renorm=3;
        codILow_RPP=codILow  [9:6]; codILow.MSB=
        (codILow_RPP==4'b1111);
    case        9'b00001xxxx:       num_renorm=4;
        codILow_RPP=codILow[9:5];   codILow_MSB=
        (codILow_RPP==5'b11111);
    case        9'b000001xxx:       num_renorm=5;
        codILow_RPP=codILow[9:4];   codILow_MSB=
        (codILow_RPP==5'b111111);
    case        9'b0000001xx:       num_renorm=6;
        codILow_RPP=codILow[9:3];   codILow_MSB=
        (codILow_RPP==6'b1111111);
    case        9'b00000001x:       num_renorm=7;
        codILow_RPP=codILow[9:2];   codILow_MSB=
        (codILow_RPP==7'b11111111);
}
// perform renormalization
codIRange=codIRange<<num_renorm;
codILow=codILow<<num_renorm;
codILow[9]=codILow_MSB;
```

In the above pseudo code, "x" means "don't care" (i.e., x can be 0 or 1).

Step 3: The ISU module 112 composes a message for renormalization post-processing. For example only, the following pseudo code may be used:

```
if(num_renorm>0){
    RPP_MSG.num_renorm=num_renorm [2:0];
    RPP_MSG.codILow_RPP=codILow_RPP[7:0];
    push RPP_MSG into renormalization post processing
        queue. }
```

The maximum number of renormalization iterations for a given MPS symbol is 1. The number of renormalization for MPS can be directly determined as follows:

num_renorm=codIRangeMPS[8]^1.

codIRangeMPS is not less than 128, and the required number of renormalization is at most 1.

The maximum number of iterations for renormalization for a given LPS symbol is 6 in the normal mode (it can reach 7 in termination encoding mode). This can be observed from the leading zeros in each entry of the lookup table rangeTabLPS.

In FIG. 2C, the ISU module 112 comprises a prediction module 120 and a shifting module 122. The ISU module 112 performs renormalization prediction using the prediction module 120 and the shifting module 122 as described below.

The renormalization prediction includes two steps: a prediction step and a renormalization step. In the prediction step, the required number of renormalizations (R) for codIRange and codILow are predicted. Additionally, the final MSB of the renormalized codILow is predicted. In the renormalization step, renormalization is performed according to step 1.

Prediction Step: (a) The required number of renormalizations for both codIRange and codILow, say R, are determined by checking the number of leading zeros in the current codIRange. If there are L leadings 0s before a 1 in codIRange, then R is equal to L. (b) Then the final MSB of the renormalized codILOW is determined as follows. The (R+1) bits from the MSB in the current CodILow (say codILOW_RPP) are compared with bits of an (R+1) bit pattern with all 1's. If the codILOW_RPP matches the all 1s' bit pattern, the variable, codILOW_MSB is set to 1; otherwise the variable codILOW_MSB is set to 0. The prediction module 120 predicts the number of renormalizations and the final MSB.

Renormalization Step: The renormalization is performed if the number of renormalizations R>0. The final codIRange and codILOW are left-shifted by R bits. The final MSB of the renormalized codILow is set to codILOW_MSB. The shifting module 122 performs the left-shift operations.

Thus, renormalization results (i.e., final values of codIRange and codILow) are predicted by matching the pattern in MSB, and the matched bits are packetized as a message. The message is later used by the RPP module 114 to complete the renormalization. Accordingly, the M coder module 106 need not wait for renormalization to complete when encoding subsequent symbols in a sequence. Instead, final values of codIRange and codILow are predicted, and the predicted values are used to continue encoding of the remaining symbols in the sequence. As explained below, bypass encoding mode and termination encoding mode are integrated into RPP. During RPP, no further side information is needed.

When mode is set to bypass encoding mode, the ISU module 112 performs the following three steps: Step 1: The ISU module 112 determines the interval lower bound (codILow). The interval range (codIRange) remains unchanged. For example only, the following pseudo code may be used:

```
codILow=codILow<<1;
if(binVal){codILow=codILow+codIRange;}
```

Step 2: As in the normal encoding mode, the completion of renormalization is deferred to the RPP module 114. The ISU module 112 performs renormalization exactly once when binVal is 0 and when binVal is 1. For example only, the following pseudo code may be used:

```
codILow_RPP=codILow[10:9];
codILow_MSB=(codILow_RPP==2'b11);
codILow[10:9]={1'b0, codILow_MSB};
```

Step 3: The ISU module 112 composes a message for renormalization post-processing. For example only, the following pseudo code may be used:

```
RPP_MSG.num_renorm=1;
RPP_MSG.codILow_RPP=codILow_RPP;
push RPP_MSG into renormalization post processing
    queue.
```

When mode is set to termination encoding mode, binVal=0 or binVal=1. Mode=Termination Encoding Mode and binVal=0 when (1) mode is normal encoding mode, (2) CtxIdx==276, and (3) binVal==0. This termination encoding mode performs the following three steps:

Step 1. Determine the interval range (codIRange).
codIRange=codIRange-2;
Step 2. This step is exactly the same as step 2 when mode is set to normal encoding mode.
Step 3. This step is exactly the same as step 3 when mode is set to normal encoding mode.

Mode=Termination Encoding Mode and binVal=1 when (1) mode is normal encoding mode, (2) CtxIdx==276, and (3) binVal==1. This termination encoding mode performs the following three steps. For example only, the following pseudo code may be used.

Step 1: Determine the interval range (codIRange).
codIRangeMPS=codIRange-2;
codILow=codILow+codIRangeMPS;
codIRange=2;
Step 2: This step is exactly the same as step 2 when mode is set to normal encoding mode.

Step 3: Compose four messages for renormalization post processing as follows:
// message 1
RPP_MSG.num_renorm=num_renorm;
RPP_MSG.codILow_RPP=codILow_RPP;
push RPP_MSG into renormalization post processing queue.
// message 2; this message is equal to PutBits((codILow>>9)&1)
RPP_MSG.num_renorm=1;
RPP_MSG.codILow_RPP=codILow[9] ? 2'b10: 2'b00;
push RPP_MSG into renormalization post processing queue.
// message 3; this message is equal to WriteBits( (codILow>>7)&3)|1, 2)
RPP_MSG.num_renorm=2;
RPP_MSG.codILow_RPP=codILow[8] ? 3'b110: 3'b010;
push RPP_MSG into renormalization post processing queue.
// message 4; this message is equal to ByteAlign
RPP_MSG.num_renorm=0;
RPP_MSG.codILow_RPP=0;
push RPP_MSG into renormalization post processing queue.

The RPP module 114 parses the messages received from the ISU module 112 and outputs encoded bitstreams. Each message comprises two parts: (1) codILow_RPP as truncated codILow, and (2) num_renorm, which represents the number of renormalization needed in codILow_RPP. The renormalization procedure checks two bits at each iteration to determine (1) the scaling method; namely E1, E2, and E3; (2) the output bits; and (3) the remainder after the scaling.

As explained above, E1 scaling is performed when interval lower bound is less than ¼. E2 scaling is performed when interval lower bound is not less than ¾. E3 scaling is performed when interval lower bound is between ¼ and ½. A bit is not output after E3 scaling. Instead, a count is maintained of E3 scaling, and a bit is output when E1 and/or E2 scaling is performed following E3 scaling.

The RPP module 114 maintains an internal register bitOutStanding (e.g., 16 bits) to keep track of the number of E3 scaling. The initial value of bitOutStanding is set to 0 at the beginning of each slice. Additionally, the RRP module 114 maintains an internal counter to count the number of encoded bits. This counter is used for byte alignment.

For example only, the following pseudo code may be used:
// num_renorm=0 represents the byte alignment requirement (for termination)
    if(num_renorm==0){
        perform byte align
        RPP is done.
    }
// perform renormalization
remainder=codILow_RPP[num_renorm];
for(i=num_renorm; i>0;i++){
    codILow_RPP[i]=remainder;
    switch(codILow_RPP[i:i-1]){
    case 2'b00://perform E1 scaling; when (¼>interval low)
        if(firstBitFlag !=0){firstBitFlag 0}
        else{write_bit(0);}
        while(bitOutStanding>0){write_bit(1); bitOutStanding—;}
        remainder=0;
    case 2'b01://perform E3 scaling; when (¾>interval low>=¼)
        bitOutStanding++;
        remainder=0;
    case 2'b10://perform E2 scaling; when (¾>interval low>=½)
        if(firstBitFlag !=0){firstBitFlag=0}
        else{write_bit(1);
        while(bitOutStanding>0){write_bit(0); bitOutStanding—;}
        remainder=0;
    case 2'b11://perform E2 scaling; when (interval low>=¾)
        if(firstBitFlag !=0){firstBitFlag=0}
        else{write_bit(1);}
        while(bitOutStanding>0){write_bit(0); bitOutStanding—;}
        remainder=1;
}}

In the above pseudo code, write_bit(x) writes one bit with value x to output buffer. Depending on processing speed for each renormalization, a depth of the RPP queue can be determined based on statistics of num_renorm and bitOutStanding.

Following is a proof of the algorithm used to truncate codILow by the ISU module 112. The proof is not specific to H.264/AVC CABAC and can be generalized to other binary arithmetic coding. Note that codILow[9] should be equal to final remainder after each bin is processed num_renorm times. So, only the value of remainder (whether 0 or 1) is material. If patterns of codILow_RPP can be directly detected, the final remainder and codILow[9] can be directly set. By doing so, the ISU module 112 avoids performing the "while loop." Instead, the "while loop" is handled by the RPP module 114.

It can be proved that the final remainder is 1 when all bits in codILow_RPP[num_renorm:0] are 1. For example, an input pattern of codILow_RPP can be derived by backtracking from the last iteration. Suppose the final remainder is 1. Then codILow_RPP[1:0] should be 2'b11. codILow_RPP[1:0] is the remainder from the previous iteration. Accordingly, the remainder in the last second iteration is also 1, which indicates codILow_RPP[2:1] should be 2'b11. By recursion, codILow_RPP[num_renorm: num_renorm-1] should be 2'b11 at the first iteration. So all bits in codILow_RPP[num_renorm:0] are 1.

On the other hand, suppose at least one bit of codILow_RPP[num_renorm:0] is 0. Let k denote the first bit as 0 from MSB; i.e. codILow_RPP[k] is 0. Two cases may be considered as follows.

Case 1: If k is equal to num_renorm+1, then codILow_RPP[k:k−1]=2'b0x. The scaling method can be only E1 and E3; and the remainder is 0. In the next iteration, codILow_RPP[k−1:k−2]=2'b0x again. The remainder is still 0. By recursion, the final remainder is 0.

Case 2: If k is less than num_renorm+1, then codILow_RPP[k:k−1]=2'bx0. The scaling method can be only E1 and E2; and the remainder is 0. At the next iteration, codILow_RPP[k−1: k−2]=2'b0x. The scaling method can be only E1 and E3; and the remainder is 0. As in case 1, by recursion, the final remainder is 0.

The M coder module 106 maintains internal registers codILow, codIRange, bitOutStanding, and firstBitFlag. The initial default values of the internal registers are set as follows:
codILow=0x000;
codIRange=0x1FE;
bitOutStanding=0; and
firstBitFlag=1.

Figure 3:
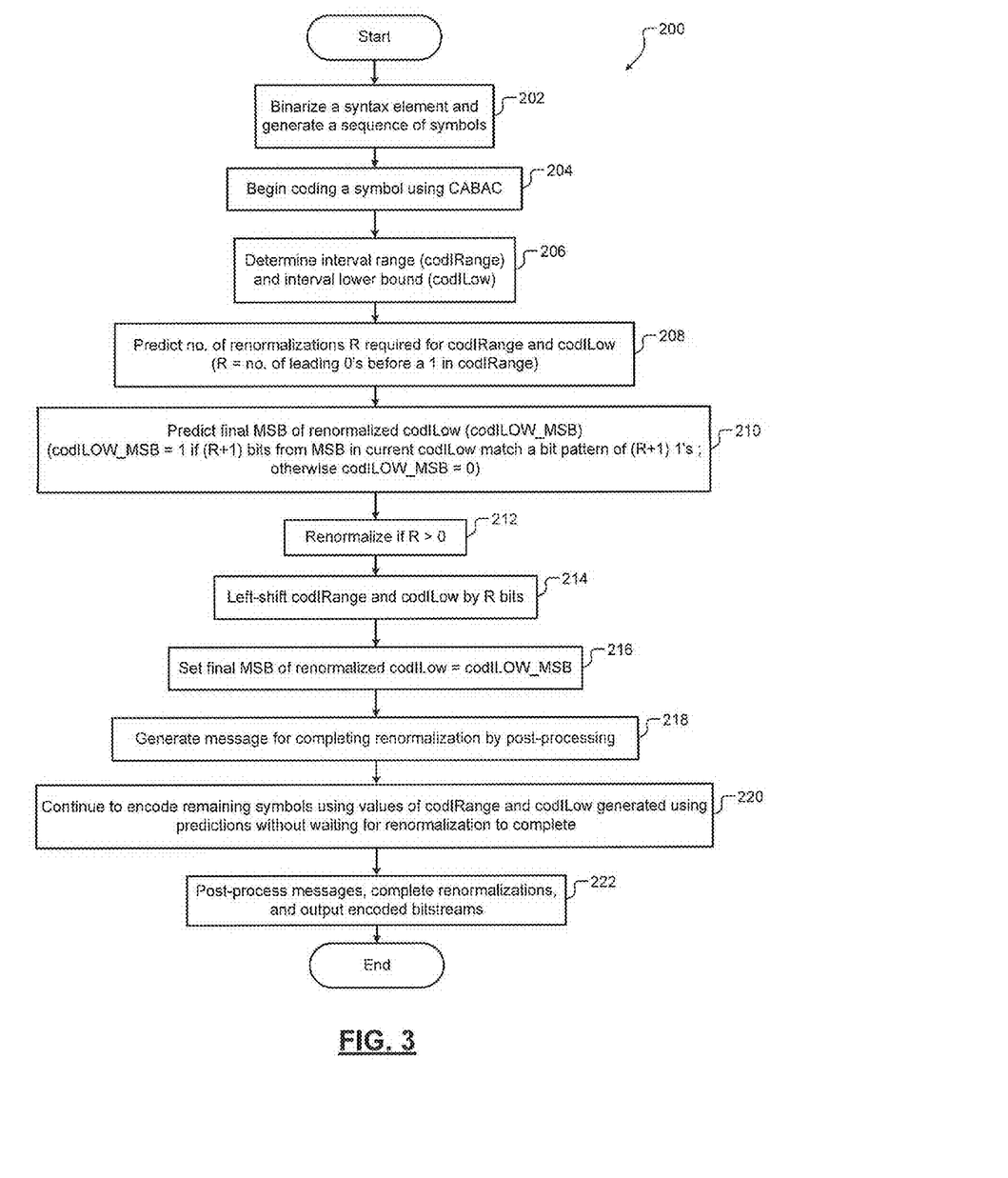
FIG. 3 is a flowchart of a method for renormalization prediction used by the CABAC encoder of FIG. 2A.

Referring now to FIG. 3, a method 200 for encoding video data using CABAC is shown. At 202, control binarizes a syntax element and generates a sequence of symbols. At 204, control begins encoding a symbol in the sequence using CABAC. At 206, control determines values of interval range (codIRange) and interval lower bound (codILow).

At 208, control predicts number of normalizations (R) required for codIRange and codILow. Control predicts R equal to the number of leading zeros before a 1 in codIRange. At 210, control predicts final MSB of renormalized codILow (i.e., codILOW_MSB). Control sets codILOW_MSB=1 when (R+1) bits from MSB in current codILow (i.e., codILOW_RPP) match a bit pattern with (R+1) 1's. Otherwise, control sets codILOW_MSB=0.

At 212, control performs normalization if R>0. At 214, control left-shifts codIRange and codILow by R bits. At 216, control sets final MSB of renormalized codILow to codILOW_MSB. At 218, control generates a message for completing renormalization by post-processing. At 220, control continues to encode remaining symbols in the sequence using values of codIRange and codILow generated using the predictions without waiting for renormalization to complete. At 222, control post-processes the messages, completes renormalizations, and outputs encoded bitstreams.

Figure 4:
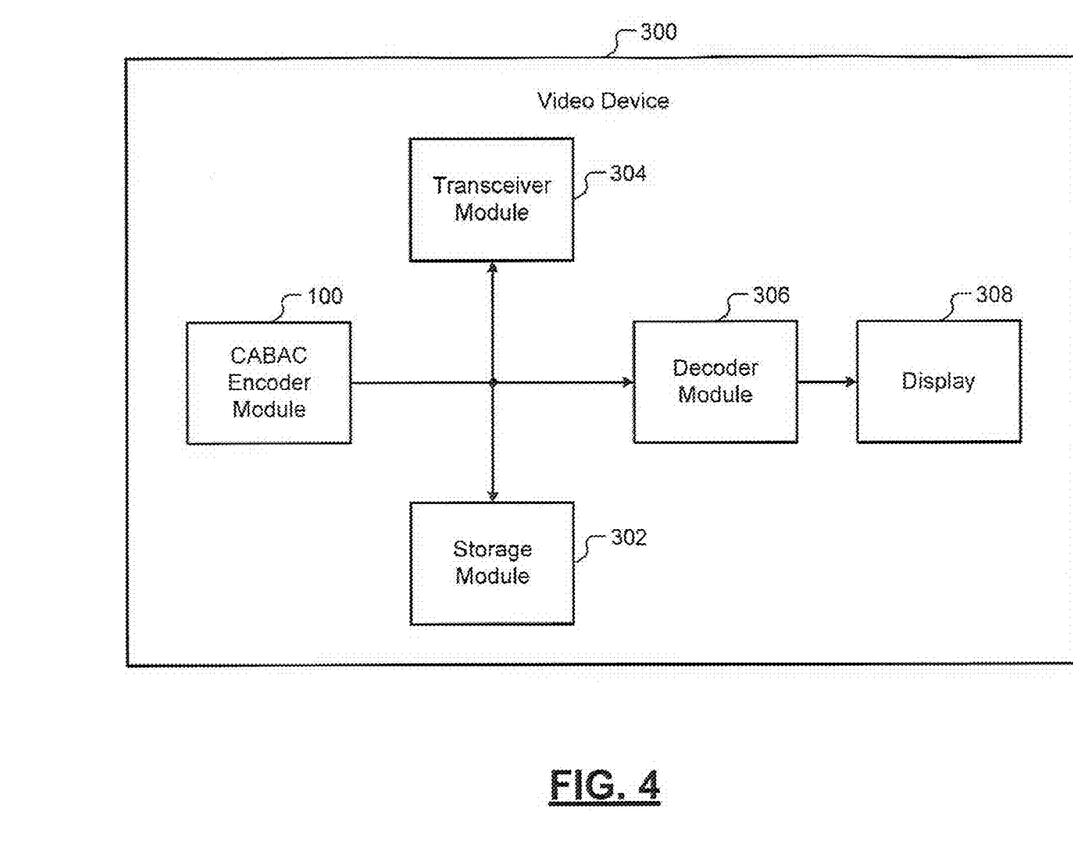
FIG. 4 is a functional block diagram of, a video device that uses the CABAC encoder of FIG. 2A.

Referring now to FIG. 4, a video device 300 comprises the CABAC encoder module 100, a storage module 302, a transceiver module 304, a decoder module 306, and a display 308. The CABAC encoder module 100 encodes video data generated by an application running on the video device 300. The storage module 302 stores the data encoded by the CABAC encoder module 100.

The transceiver module 304 transmits the data encoded by the CABAC encoder module 100. Additionally, the transceiver module 304 receives encoded data from other devices. The decoder module 306 decodes the data encoded by the CABAC encoder module 100. Additionally, the decoder module 306 decodes the encoded data received from other devices. The display 308 displays the data decoded by the decoder module 306.

The video device 300 may be a digital versatile disc (DVD) drive, a digital television, an audiovisual device, or a multimedia device. The video device 300 may store and/or broadcast video data. The video device 300 may run applications that include video-conferencing, Internet-based video streaming, and motion pictures.

Throughout the present disclosure, video data and video encoding are used for example only. The teachings of the present disclosure are applicable to other types of data and encoding.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
a binarization module configured to binarize a syntax element and to generate symbols;
an encoding module configured to encode the symbols using context-adaptive binary arithmetic coding (CABAL); and
a prediction module configured to generate a prediction for a number of renormalization to be performed to renormalize an interval range when encoding one of the symbols,
wherein the encoding module encodes a next symbol following the one of the symbols based on the prediction before renormalization of the interval range is actually completed.

2. The system of claim 1, further comprising a processing module configured to complete renormalization of the interval range based on the prediction.

3. The system of claim 1, further comprising a processing module configured to generate an encoded bitstream for the symbols based on the prediction.

4. The system of claim 1, wherein the number of renormalizations is equal to a number of leading zeros before a 1 in a binary representation of the interval range.

5. A system, comprising:
a binarization module configured to binarize a syntax element and to generate symbols;
an encoding module configured to encode the symbols using context-adaptive binary arithmetic coding (CABAC);
a prediction module configured to generate a prediction for a number of renormalizations to be performed to renormalize an interval range when encoding one of the symbols; and
a shifting module configured to generate a renormalized interval range by shifting the binary value R times, where R is a number of leading zeros before a 1 in the binary value,
wherein the encoding module encodes a next symbol following the one of the symbols based on the renormalized interval range.

6. The system of claim 5, wherein:
the interval range is a difference between a high value and a low value;
the shifting module generates a renormalized low value by shifting a binary value of the low value R times; and
the encoding module encodes the next symbol based on the renormalized low value.

7. The system of claim 6, wherein the prediction module generates a predicted most significant bit (MSB) for the renormalized low value based on (R+1) bits from a MSB of the binary value of the low value.

8. The system of claim 7, wherein the prediction module sets a MSB of the renormalized low value equal to the predicted MSB.

9. A device, comprising:
the system of claim 1;
a decoder module configured to decode the symbols encoded by the encoding module and to output video data; and
a display configured to display the video data.

10. A device, comprising:
the system of claim 1;
a storage module configured to store the symbols encoded by the encoding module; and
a transmit module configured to transmit the symbols encoded by the encoding module.

11. A method, comprising:
binarizing a syntax element and generating symbols;
encoding the symbols using context-adaptive binary arithmetic coding (CABAC);
generating a prediction for a number of renormalizations to be performed to renormalize an interval range when encoding one of the symbols; and
encoding a next symbol following the one of the symbols based on the prediction before renormalization of the interval range is actually completed.

12. The method of claim 11, further comprising a completing renormalization of the interval range based on the prediction.

13. The method of claim 11, further comprising generating an encoded bitstream for the symbols based on the prediction.

14. The method of claim 11, wherein the number of renormalizations is equal to a number of leading zeros before a 1 in a binary representation of the interval range.

15. A method, comprising:

binarizing a syntax element and generating symbols;

encoding the symbols using context-adaptive binary arithmetic coding (CABAC);

generating a prediction for a number of renormalizations to be performed to renormalize an interval range when encoding one of the symbols;

generating a renormalized interval range by shifting the binary value R times, where R is a number of leading zeros before a 1 in the binary value; and encoding a next symbol following the one of the symbols based on the renormalized interval range.

16. The method of claim 15, wherein the interval range is a difference between a high value and a low value, the method further comprising:

generating a renormalized low value by shifting a binary value of the low value R times; and encoding the next symbol based on the renormalized low value.

17. The method of claim 16, further comprising generating a predicted most significant bit (MSB) for the renormalized low value based on (R+1) bits from a MSB of the binary value of the low value.

18. The method of claim 17, further comprising setting a MSB of the renormalized low value equal to the predicted MSB.

* * * * *